United States Patent
Fukada et al.

(10) Patent No.: US 6,563,211 B2
(45) Date of Patent: May 13, 2003

(54) SEMICONDUCTOR DEVICE FOR CONTROLLING ELECTRICITY

(75) Inventors: Masakazu Fukada, Tokyo (JP); Hiroshi Nishibori, Fukuoka (JP); Takanobu Yoshida, Fukuoka (JP); Naoki Yoshimatsu, Fukuoka (JP); Nobuyoshi Kimoto, Fukuoka (JP); Haruo Takao, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/791,794

(22) Filed: Feb. 26, 2001

(65) Prior Publication Data

US 2002/0047132 A1 Apr. 25, 2002

(30) Foreign Application Priority Data

Aug. 30, 2000 (JP) ........................................ 2000-260521

(51) Int. Cl.$^7$ ........................ H01L 23/34; H01L 23/06; H01L 23/13; H01L 23/04
(52) U.S. Cl. ........................ 257/706; 257/678; 257/701; 257/703
(58) Field of Search ................................ 257/701, 703, 257/706

(56) References Cited

U.S. PATENT DOCUMENTS

| 5,646,445 A | * | 7/1997 | Masumoto et al. | ......... 257/723 |
|---|---|---|---|---|
| 5,710,068 A | * | 1/1998 | Hill | ......... 437/415 M |
| 5,767,576 A | * | 6/1998 | Kobayashi et al. | ......... 257/701 |
| 5,834,842 A | * | 11/1998 | Majumdar et al. | ......... 257/718 |
| 5,920,119 A | * | 6/1999 | Tamba et al. | ......... 257/718 |
| 5,926,372 A | * | 7/1999 | Rinehart et al. | ......... 361/704 |
| 6,278,181 B1 | * | 8/2001 | Maley | ......... 257/712 |

FOREIGN PATENT DOCUMENTS

JP   405145008 A   *   6/1993   .......... H01L/23/58

\* cited by examiner

*Primary Examiner*—Nathan J. Flynn
*Assistant Examiner*—Johannes P Mondt
(74) *Attorney, Agent, or Firm*—Oblon, Spivak, McClelland, Maier & Neustadt, P.C.

(57) ABSTRACT

A semiconductor device for controlling electricity including a metal base plate and at least one insulating substrate. The insulating substrate includes an insulator plate, a back-side pattern on a back face of the insulator plate and bonded to the metal base plate, and two circuit patterns located on a front face of the insulator plate and above the back-side pattern. Each of the two circuit patterns has an "L" shape and extends along two sides of the insulator plate that are continued and perpendicular to each other. The two circuit patterns are also arranged at opposed corners of the insulator plate in a centrosymmetrical relation each other. Further, in each circuit pattern, a switching element is sandwiched between a free-wheel diode and an electrode area.

5 Claims, 6 Drawing Sheets

SEMICONDUCTOR DEVICE FOR CONTROLLING ELECTRICITY

BACKGROUND OF THE INVENTION

1. Field of the Invention

The present invention relates to a semiconductor device for controlling electricity and, more particularly, to the semiconductor device of kind including an insulating substrate having a back-side metal pattern on its back face, which pattern is bonded to a metal base plate by a binder, and a pair of circuit patterns on its front face.

2. Description of the Prior Art

IPM (Intelligent Power Module) has been known as a semiconductor device for controlling electricity and is used in, for example, a drive control of an electric car. However, a need has been recognized for the electricity control device that has a longer life and a higher reliability in severe conditions of heat or vibration. FIGS. 4 through 7 show an example of such a conventional semiconductor device for controlling electricity.

In FIGS. 4 through 6, reference numeral 1 denotes a generally rectangular metal base plate made of, for instance, a copper-molybdenum alloy. This metal base plate 1 has boltholes each defined in a corner region thereof for attachment of the metal base plate 1 to a radiating fin assembly (not shown in the Figures). Reference numeral 2 denotes insulating substrates fixed on the metal base plate 1 by means of soldering. Each of those insulating substrates 2 consists of an insulator plate 3 made of aluminum nitride, a pair of copper circuit patterns 4 formed on a front face of the insulator plate 3 and a back-side pattern 5 formed on a back face of the plate 3. Each insulating substrate 2 is fixed on the metal base plate 1 with the back-side pattern 5 soldered thereto. Reference numeral 6 denotes insulated gate bipolar transistors (IGBTs) as switching semiconductor devices for controlling electricity, and reference numeral 7 denotes free-wheel diodes (hereinafter, referred as FWDs) each paired with the adjacent IGBT 6. A pair of IGBT 6 and FWD 7 are soldered on each of the circuit patterns 4. Reference numeral 9 denotes a solder layer interposed between the metal base plate 1 and the back-side pattern 5 of the insulating substrate 2, and reference numeral 9a denotes a solder layer interposed between each circuit pattern 4 and the associated pair of IGBT 6 and FWD 7. Reference numeral 10 denotes a pair of thermistors mounted on a center area of each insulated substrate 2 between the circuit patterns 4 of the associated pair for detecting the temperature of such insulating substrate 2.

Reference numeral 11 denotes a resinous cover having boltholes 11a defined therein in alignment with the respective boltholes in the metal base plate 1 for attachment thereof together with the metal base plate 1 to the radiating fin assembly (not shown). The metal base plate 1 and the cover 11 are assembled together to define a generally rectangular box-like case with the base plate 1 serving as a bottom wall, and the insulating substrates 2, IGBTs 6 and FWDs 7 on the metal base plate 1 are thus encased within the case so defined. Reference numeral 12 denotes main circuit terminals inserted into the cover 11. Each of those main circuit terminals has outer and inner ends with the outer end positioned outside the case and with the inner end connected to the associated IGBT 6 and FWD 7 by means of aluminum wires 13. Reference numeral 14 denotes electrodes for a controlling circuit, and reference numeral 15 denotes a cover plate for the above-described case. It is to be noted that respective connections between the electrodes 14 and the controlling circuit board are not shown.

It is to be noted that the terminals employed in the illustrated electricity control device and generally identified by 12 as described above are many, but have different functional attributes. Accordingly, the terminals 12 have respective suffixes annexed (P), (N), (U), (V) and (W) thereto to show that the terminals 12(P) and 12(N) serve as positive and negative input terminals, respectively, and the terminals 12(U), 12(V) and 12(W) serve as respective three-phase output terminals, i.e., U-phase, V-phase and W-phase output terminals, respectively. In addition, symbols (U), (V) and (W) affixed to the reference numeral 2 to denote each of the insulating substrates 2 in general are intended to show that the insulated substrates 2(U), 2(V) and 2(W) are those associated respectively with three phase switching circuits each comprised of the corresponding IGBT 6 and the FWD 7 connected parallel, but in reverse relation to such IGBT 6. Symbols (H) and (L) affixed to the reference numeral 4 used to generally identify each circuit pattern denote respective two switching devices in each switching circuit in higher and lower voltage side, respectively.

FIG. 7 shows a circuit diagram of a main inverter circuit included in the semiconductor device for controlling electricity shown in FIGS. 4 through 6. Even in the circuit diagram of FIG. 7, similar symbols P, N, U, V and W are employed whicyh correspond respectively to 12(P), 12(N), 12(U), 12(V) and 12(W). Similarly, symbols 2(U), 2(V), 2(W), 4(H) and 4(L) used in FIG. 7 correspond to 2(U), 2(V), 2(W), 4(H) and 4(L) used in FIGS. 4 through 6, respectively.

Arrangement of IGBTs 6 and FWDs 7 on the insulating substrates 2, mounted on the metal base plate 1, will now be described. In FIGS. 4 through 6, the three insulating substrates 2 are disposed on the metal base plate 1 in line with each other and spaced a predetermined distance from each other. Each substrate 2 is soldered on the metal base plate 1 via the back-side pattern on the back face of the substrate. The solder layer 9 is formed between the metal base plate 1 and the back-side pattern on each substrate 2. Each pair of circuit patterns 4 on the front face of the insulating substrate 2 are placed above the back-side pattern 5 via the associated insulator plate 3.

Each circuit pattern 4 is of a generally L-shaped configuration extending in part along one of four sides of the corresponding insulator plate 3 and in part along another one of the four sides thereof which is continued from and lies perpendicular to such one of the four sides of the corresponding insulator plate 3. Two L-shaped circuit patterns 4 on the respective insulator plate 3 are disposed centrosymmetrically with respect to each other. In each circuit pattern 4, IGBT 6 is positioned near the corner, FWD 7 is next to IGBT 6 along one side, and electrode-pattern region 4a is along another side of the insulator plate 3. That is, IGBT 6 and the electrode-pattern regions 4a are placed alternately on the metal base plate 1 so that the inner ends of the main circuit terminals 12 extending into the case are connected the shortest distance with IGBT 6 and the electrode-pattern regions 4a. A pair of thermistors 10 for detecting the temperature of the insulating substrate 2 are disposed between the two circuit patterns 4 at a location generally in alignment with the center of the insulating substrate 2. Hereinafter, the function of the device will be described. During a current flowing in the main circuit, IGBT 6 repeats switching motion, and IGBT 6 and FWD 7 generate a heat which is then transferred to the metal base plate 1 through the solder layer 9a, the circuit pattern 4, the insulator 3, the back-side pattern 5 and the solder layer 9. The heat transmitted to the metal base plate 1 is diffused to the radiating fin assembly (not shown) attached to the metal base plate 1.

During the heat transfer, the solder layer 9 that is used to connect the back-side pattern 5 with the metal base plate 1 suffers from a complicated heat stress. The heat stress is caused by a variety of reasons; a difference in thermal-expansion coefficient between the metal base plate 1 and the insulator plate 3, which is combined with the back-side pattern 5; a temperature gradient between the metal base plate 1 and the back-side pattern 5; and a spatial variation of the temperature gradient caused by a temperature distribution in the back-side electrode 5, in which a part near the highly-heat-generating IGBT 6 has higher temperature than other parts.

The conventional semiconductor device of the structure discussed above has numerous problems as follows. Firstly, small cracks may occur in the solder layer 9 by heat cycles that inevitably arise when the device is set in an engine compartment or that is generated by a start-and-stop operation of IGBT 6. The small cracks generally start from corners of the back-side pattern 5. At the corners of the pattern 5, a distance from a center of the back-side pattern 5 and, thus, an amount of an expansion or shrinkage by heat is maximum. Also, strains are apt to concentrate at the corners. The generated cracks run toward the center of the back-side pattern 5. When the cracks in the solder layer 9 reach under a part of the back-side pattern 5 under IGBT 6, a heat-radiating ability of this part is reduced. This may result in heat breaking of IGBT 6.

Secondly, IGBT 6 placed near the corner of the back-side pattern 5 may be extraordinarily heated under influence of the small cracks that have developed from the corners of the back-side pattern. Although the thermistors 10 are mounted in the center area of the insulating substrate 2 for detecting the temperature of the substrate 2, the thermistors 10 are located too far from the heating-up point to detect the heat accurately. This renders it difficult to grasp the lifetime of the device.

SUMMARY OF THE INVENTION

It is accordingly an object of the present invention to provide a semiconductor device for controlling electricity that is less susceptible to small cracks in a solder layer between a metal base plate and a back-side pattern of an insulating substrate, and capable of extending the lifetime and that can be assembled compact.

It is another object of the present invention to provide a semiconductor device for controlling electricity that has a high detecting ability for an extraordinary heating of a switching semiconductor device mounted on a insulating substrate, and is capable of predicting the lifetime of the device highly accurately.

In accordance with a first aspect of the present invention, a semiconductor device for controlling electricity includes:
(a) a metal base plate; and
(b) at least one insulating substrate including
  (1) an insulator plate,
  (2) a back-side pattern on a back face of the insulator plate, the back-side pattern being bonded to the metal base plate and
  (3) two circuit patterns located on a front face of the insulator plate and above the back-side pattern, each of the circuit patterns including a semiconductor switching element for controlling electricity, a free-wheel diode paired with the switching element, and an electrode area. Each of the circuit patterns is of a shape generally similar to the ahspe of a figure "L" and extending along two sides of the insulator plate that are continued to and lie perpendicular to each other. The two circuit patterns are arranged at opposed corners of the insulator plate in a centrosymmetrical relation with respect to each other. The switching element is sandwiched between the free-wheel diode and the electrode area in each of the circuit patterns. The highly heat generating switching element is placed apart from corners of the back-side pattern. Accordingly, the semiconductor device of the present invention is highly resistive against the cracks in a binder between the back-side pattern and the metal base plate that occur at the corners of the back-side pattern by the effect of heat cycles caused by, for example, a start-and stop operation of the switching operation.

In accordance with a second aspect of the present invention, the semiconductor device has an auxiliary electrode that is connected to the electrode area. The width of the electrode area may be reduced by increasing the thickness of the auxiliary electrode. As a result, the size of each of the insulating substrate and the metal base plate is reduced. Therefore, a highly reliable and compact semiconductor device can be provided.

In accordance with a third aspect of the present invention, the two switching elements and the two free-wheel diodes are arranged in a checker pattern and are sandwiched by the two auxiliary electrodes placed along opposite sides of the insulator plate. Thus, the switching elements and the free-wheel diodes, which generate heat, may be spaced apart from all corners of the back-side pattern with no need to increase the size of the insulating substrate. Accordingly, the semiconductor device can be provided that is small-sized, compact and, however, highly resistive against the cracks in the binder by the heat cycles caused by, for example, the start-and-stop operation of the switching element.

In accordance with a fourth aspect of the present invention, the insulator plate is made of ceramics; the back-side pattern and the circuit patterns are made of copper or aluminum; the metal base plate is made of copper or aluminum; and the back-side pattern is bonded to the metal base plate by means of solder. This result in the semiconductor device having a superior cooling characteristic and capable of being produced at a low cost.

In accordance with the fifth aspect of the invention, the switching element is of a rectangular shape having sides of a length greater than 14 mm and is capable of being received in an area of 25 mm radius on a front face of the insulating substrate. Thus, the semiconductor device having a large capacity and a long life can be provided.

In accordance with the sixth aspect of the invention, the semiconductor device has a temperature sensor placed on said switching device at or near a corner of the back-side pattern. The temperature sensor can detect an extraordinary heating of the switching element before the element is broken by the heat. Therefore, the life of the semiconductor device can be accurately predicted. This increases the reliability of the semiconductor device.

BRIEF DESCRIPTION OF THE DRAWINGS

The above and other objectives and features of the present invention will become more apparent from description of a preferred embodiment thereof with reference to the accompanying drawings, throughout which like parts are designated by like reference numerals, and wherein.

DETAILED DESCRIPTION OF THE PREFERRED EMBODIMENTS

Figure 1:
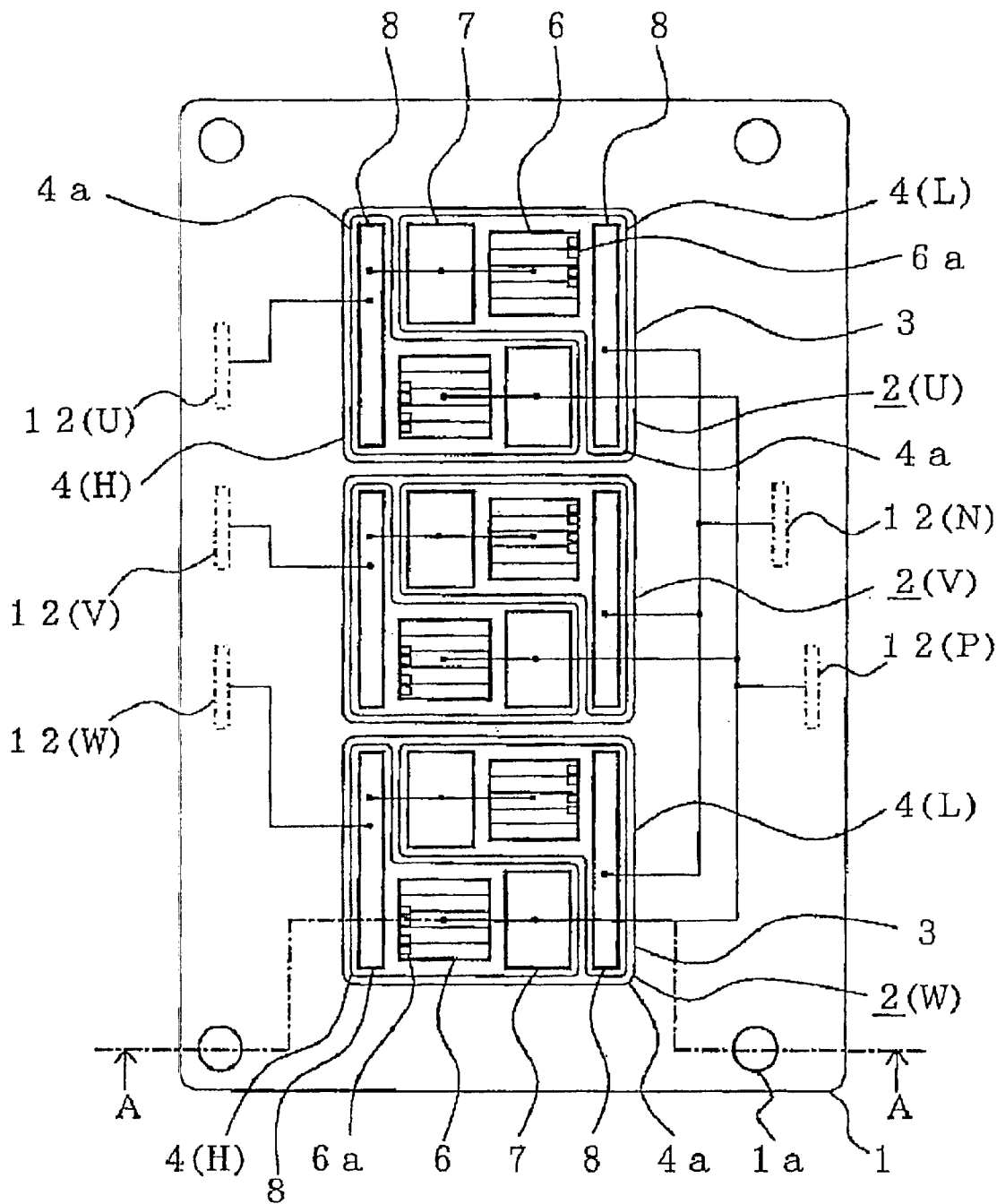
FIG. 1 is a plane view of an embodiment of a semiconductor device for controlling electricity according to the present invention.
Figure 2:
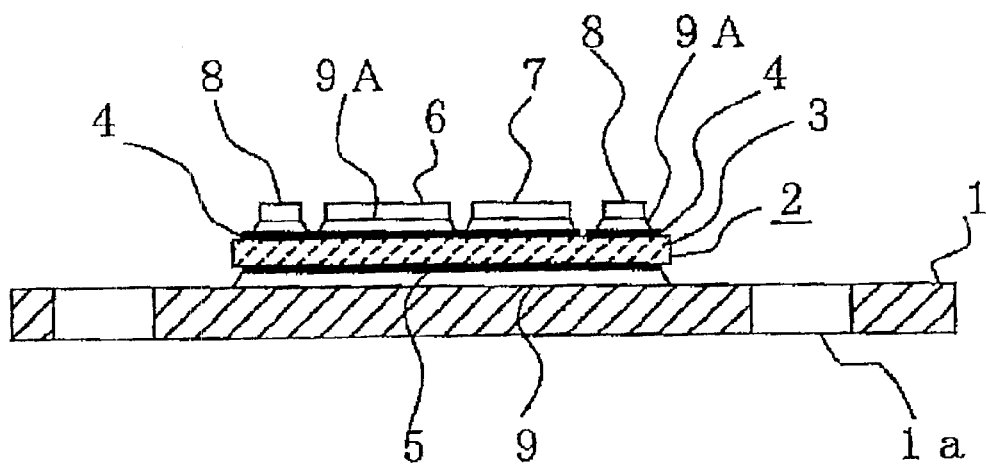
FIG. 2 is a cross-sectional view taken along the line A—A of the semiconductor device of FIG. 1.

The application is based on application No. 2000-260521 filed in Japan, the content of which is incorporated herein by reference.

One embodiment of a semiconductor device for controlling electricity according to the present invention is shown in FIGS. 1 through 3 and 7. In these figures, like reference numerals represent identical or corresponding parts. Reference numeral 1 denotes a metal base plate which is made of copper and has boltholes defined at four corners thereof for attachment of the semiconductor device to a radiating fin assembly (not shown). Reference numeral 2 denotes an insulating substrate fixed on the metal base plate 1 by means of soldering. The insulating substrate 2 includes an insulator plate 3 made of ceramics such as, for example, aluminum nitride, a pair of copper circuit patterns 4 formed on a front face of the insulator plate 3 and a back-side pattern 5 made of a copper foil and formed on a back face of the plate 3. The back-side pattern 5 is soldered on the metal base plate 1. Reference numeral 6 denotes IGBTs as semiconductor switching devices for controlling electricity. Each IGBT 6 includes a thermosensor (not shown) integrated together therewith, which sensor has sensor electrodes shown generally by 6a. The thermosensor is used to detect the temperature of the IGBT 6 itself by means of a diode having a forward negative temperature characteristics of resistance.

Reference numeral 7 denotes FWDs, each of which is paired with the corresponding IGBT 6. A pair of IGBT 6 and FWD 7 are soldered on each of the circuit patterns 4. Reference numeral 9 denotes a solder layer connecting between the metal base plate 1 and the back-side pattern 5 of the insulating substrate 2, and 9a denotes a solder layer connecting between the circuit pattern 4 and a group of the IGBT 6, FWD 7 and an auxiliary electrode 8.

As is the case with the conventional semiconductor device shown in and described with reference to the FIGS. 4 to 6, the semiconductor device of this embodiment includes a resin cover (not shown). The metal base plate 1 and the cover 11 are assembled together to define a case with the base plate 1 serving as a bottom wall, and the insulating substrate 2, IGBT 6 and FWD 7 on the metal base plate 1 are thus encased within the case so defined. Such a construction is substantially similar to that in the conventional semiconductor device and, accordingly, no further detail will be reiterated for the sake of brevity. Reference numeral 12 denotes main circuit terminals inserted into the cover (not shown) with its one end exposed to the outside for connection with an external circuit.

Figure 4:
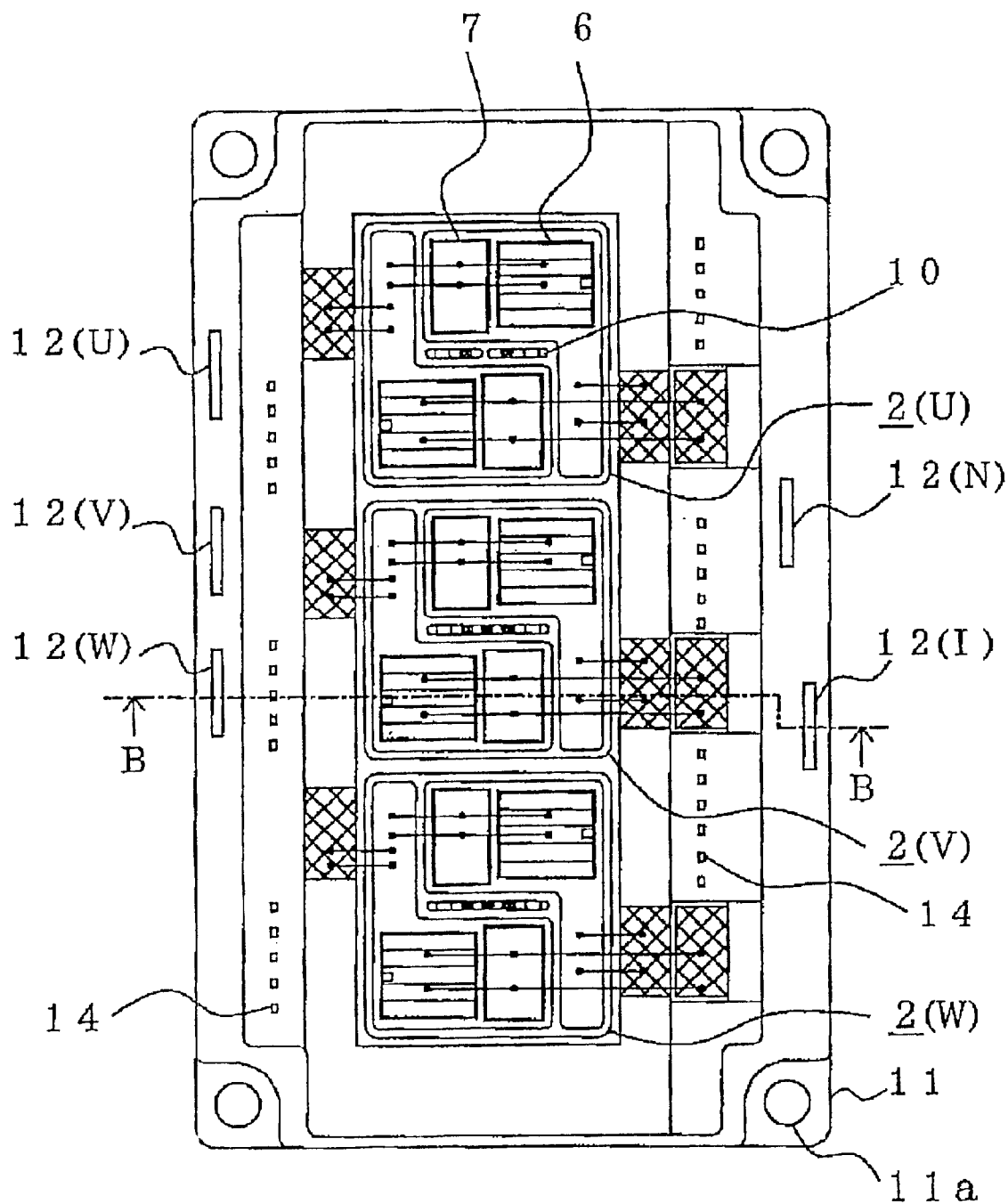
FIG. 4 is a plane view of the conventional semiconductor device for controlling electricity.
Figure 5:
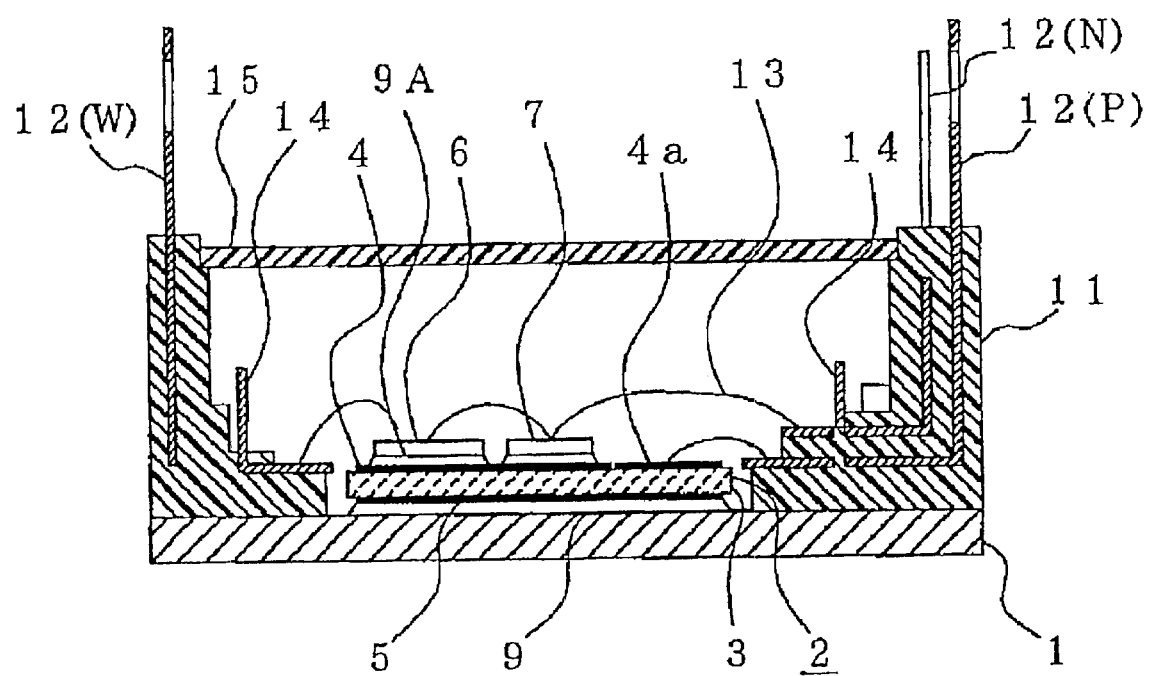
FIG. 5 is a cross-sectional view taken along the line B—B of the semiconductor device of FIG. 4.
Figure 6:
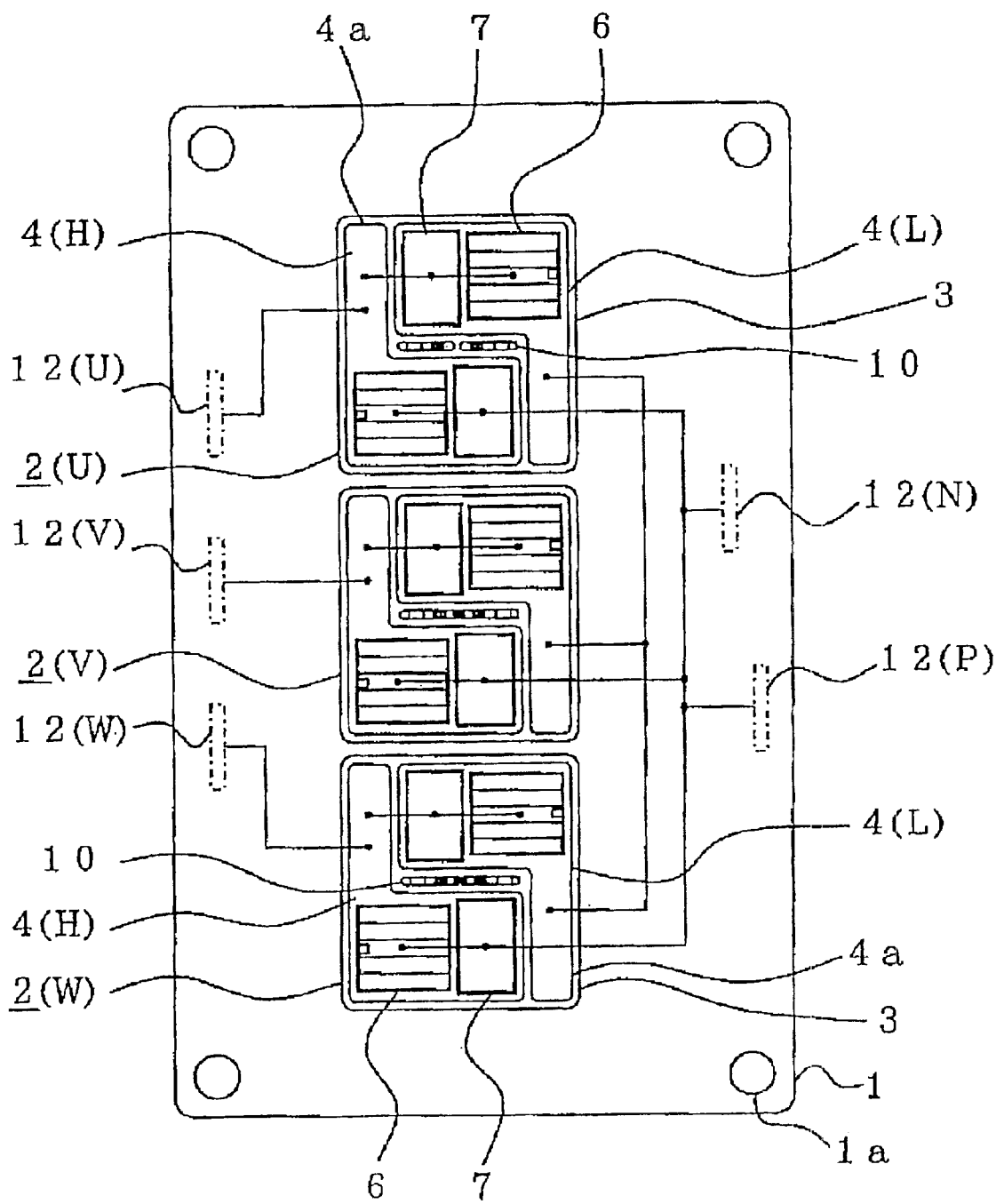
FIG. 6 is a plane view of an insulating substrate of the semiconductor device of FIG. 5.

In FIG. 1, the same symbols as those used in FIGS. 4 to 6 are employed in connection with the terminals 12 and the insulating substrates 2 to denote the same functional attributes.

Figure 7:
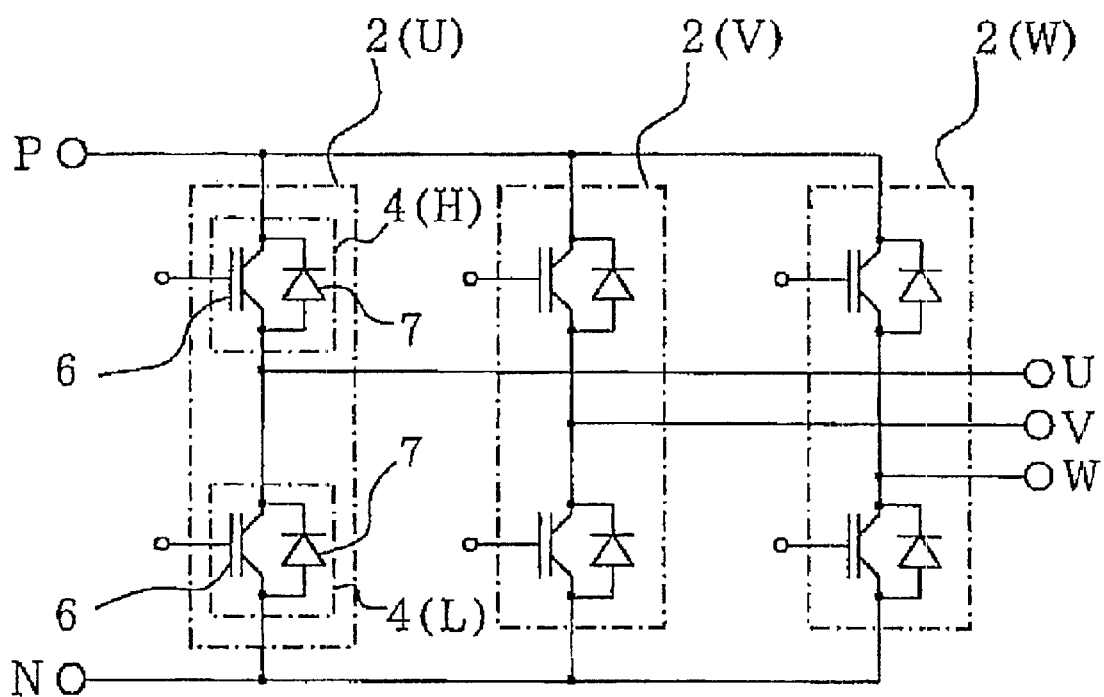
FIG. 7 is a circuit diagram of a main circuit that is commonly included in the semiconductor device of FIGS. 1 to 4.

The main circuit employed in the semiconductor device embodying the present invention is identical with that shown in FIG. 7.

The IGBT 6, FWD 7 and the auxiliary electrode 8 on the insulating substrate 2 are arranged in a manner which will now described. As shown in FIG. 1, three insulating substrates 2 are disposed in line with each other and spaced a predetermined from each other. Each substrate 2 is soldered on the metal base plate 1 via the back-side pattern 5 on the back face of the substrate 2.

Figure 3:
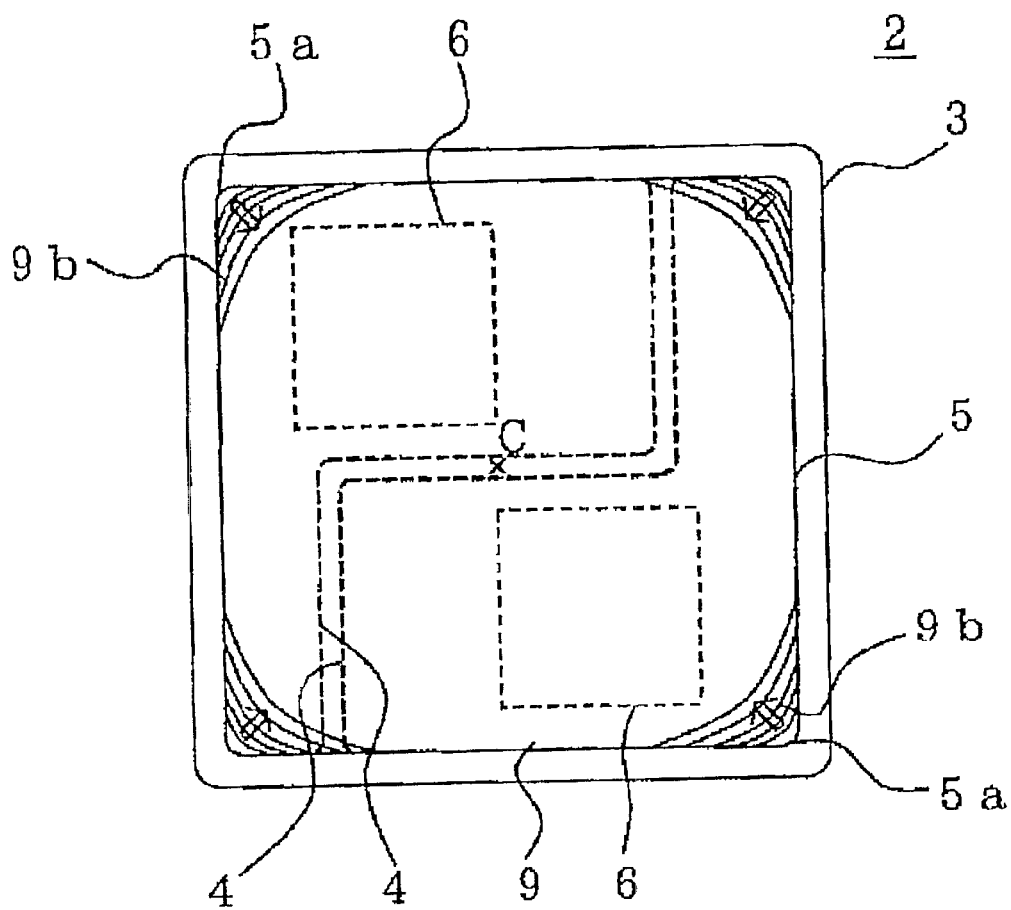
FIG. 3 is a rear view of an insulating substrate used in the semiconductor device of FIG. 1.

FIG. 3 is a plane view of each insulating substrate 2 viewed from the side of the back-side pattern 5. A pair of circuit patterns 4 and the position where the associated IGBTs 6 are soldered are shown by dottedlines, which position is the most heat-generating position of the circuit pattern 4. As clearly shown in FIGS. 2 and 3, the pair of circuit patterns 4 are formed on the surface of the insulating substrate 2 so that the patterns 4 may occupy respective positions above the back-side pattern 5 across the corresponding insulator plate 3.

Each circuit pattern 4 is of a generally L-shaped configuration extending in part along one of four sides of the corresponding insulator plate 3 and in part along another one of the four sides thereof which is continued from and lies perpendicular to such one of the four sides of the corresponding insulator plate 3. The auxiliary electrode 8 is along one side of the insulator plate, the auxiliary electrode 8, IGBT 6 and FWD 7 are along another side of the insulator plate 3. The auxiliary electrode 8, IGBT 6 and FWD 7 are fixed by means of solder. That is, two sets of IGBT 6 and FWD 7 are arranged to form a checker pattern, and a pair of auxiliary electrodes are placed along face-to-face sides of the insulator plate 3 to sandwich the two sets of IGBT 6 and FWD 7.

A pair of switching devices each including the IGBT 6 and the FWD 7 connected with such IGBT 6 in reverse parallel relation thereto, are formed in each of the circuit patterns 4 on the three insulating substrates 2 on the metal base plate 1. The pair of the switching devices are connected in series with each other on the insulating substrate 2. Thus, the main circuit of a three-phase inverter is formed on the metal base plate 1 as can be seen from FIG. 1 and the circuit diagram of FIG. 7. The pair of the switching devices are arranged compactly in each of the three insulating substrates 2. As a result, the main circuit of three-phase inverter is compactly formed on the metal base plate 1.

Hereinafter, the function of the device according to this embodiment will be described. When the semiconductor device for controlling electricity is used as an inverter, a current flow in the main circuit and a repeated switching motion of IGBT 6 causes the IGBTs 6 and the FWDs 7 to generate heat. The generated heat is transferred to the metal base plate 1 through the solder layer 9a, the circuit pattern 4, the insulator plate 3, the back-side pattern 5 and the solder layer 9. Then, the heat is diffused to the radiating fin assembly (not shown) attached to the metal base plate 1.

During the heat transfer, the solder layer 9 that connects the back-side pattern 5 with the metal base plate 1 suffers a complicated heat stress. The heat stress is caused by a variety of reasons; a difference in thermal-expansion coefficient between the metal base plate 1 and the insulator plate 3, which is combined with the back-side pattern 5; a temperature gradient between the metal base plate 1 and the back-side pattern 5; and a spatial variation of the temperature gradient caused by a temperature distribution in the back-side electrode 5, in which a part near the highly-heat-generating IGBT 6 has higher temperature than other parts.

Heat cycle that inevitably arise when the device is set in an engine compartment, as well as the heat cycle generated by a start-and-stop operation of IGBT 6, may cause cracks in the solder layer 9. As shown in FIG. 3, the small cracks generally run from corners of the back-side pattern 5, where a distance from a center of the back-side pattern 5 is maximum and, thus, strains are apt to concentrate thereat. The generated small cracks run toward the center of the back-side pattern 5 and grow to big cracks. The cracks in the solder layer 9 increase a heat resistance of the solder layer 9 and reduce the heat-radiating efficiency. If the cracks in the solder layer 9 reach under a part of the back-side pattern 5 under IGBT 6, IGBT 6 may be extraordinarily heated to break down.

However, the pair of circuit pattern 4 on the insulating substrate 2 of the semiconductor device of this embodiment has such a construction that two sets of the IGBTs 6 and the FWDs 7 are sandwiched by and between the pair of auxiliary electrodes 8. The auxiliary electrodes 8 exist at the corner 5a of the back-side pattern 5, and highly heat-generating IGBT 6 and considerably heat-generating FWD 7 are placed away from the corner 5a. Even when IGBT 6 repeats a start-and-stop operation, the temperature of the corner 5a of the back-side pattern 5 is lower than that of the part under IGBT 6 or FWD 7. The generation and growth of the small cracks 9b in the solder layer 9 is suppressed at the corner 5a of the back-side pattern 5. Even if the small cracks generate and grow at the corner 5a, the long distance between IGBT 6 or FWD 7 and the corner 5a of the back-side pattern 5 prevents the cracks from reaching under IGBT 6 or FWD 7 in a short time. That is, even if the small cracks generate by the effect of the heat cycle that arises in the engine compartment and by the heat cycle caused by a start-and-stop operation of IGBT 6, the small cracks reach under IGBT 6 or FWD 7 after a long period of time. Accordingly, the semiconductor device of this embodiment is highly resistive against the heat cycles and has a long life and high reliability.

The thermosensor formed integrally on the IGBT 6 is located at the furthest position from the center of the insulating substrate 2, i.e., at the position near the corner 5a of the back-side pattern 5 and where an influence of the poor heat radiation that is caused by the small cracks 9b having grown toward the center of the back-side pattern appears first. Accordingly, it is possible to detect the growth of the small cracks 9b before IGBT 6 breaks down by the heat and to know the accurate lifetime.

Since the auxiliary electrodes 8 are connected to the electrode pattern regions 4a, a width of the electrode pattern region 4a may be reduced by increasing the thickness of the auxiliary electrode 8. This results in reduction of the size of the insulating substrate 2 and the metal base plate 1. Therefore, the inductance of the main circuit and the size of the semiconductor device are reduced.

The larger the insulating substrate 2 is, the longer the distance from the center to the corner 5a of the back-side pattern 5. The long distance between the center and the corner 5a of the back-side pattern increases a warping or shearing force applied to the solder layer 9, which is caused by a difference of a thermal expansion coefficient between the metal base plate 1 and the insulator plate 3 at the corner 5a. This encourages generation and growth of the small cracks 9b. It is preferable that for preventing the generation and growth of the small cracks 9b in the solder layer 9 the size of the insulating substrate 2 be reduced within the limit that the heat transfer to the metal base plate 1 is not prevented.

In order to confirm this matter, a test was performed. An insulating substrate composed of a metal base plate 1 made of copper and an insulator plate 3 made of aluminum nitride was employed. IGBT 6 of a rating class 600A was arranged on the 45 mm×48 mm rectangular insulating substrate 2 as shown in FIG. 1. Heat cycle test of −40 to 125° C. was performed. In the case the pair of IGBT 6 arranged in crisscross was within 25 mm from a center of the insulating substrate 2, the progress of the small cracks was very slow. The device kept its function even after 2000 or more heat cycles.

On the other hand, when IGBT 6 was not within 25 mm from the center of the insulating substrate 2, which was larger than the above-described one, the small cracks 9b grew rapidly and the device had a short lifetime.

IGBT 6 for a semiconductor device for controlling electricity of rating class 600A, which class is in a high demand, needs 14 mm square size. However, even when IGBTs of 15 mm square in size are employed and are arranged in crisscross on the pair of circuit pattern 4 formed centrosymmetrically on the insulating substrate 2, the IGBTs 6 can be easily placed within a 25 mm radius area.

As a result, using an insulating substrate 2 and a metal base plate 1 having a size of, in conventional device, rating class 300A, i.e., using a rectangular insulating substrate 2 of 45 mm×48 mm in size, a semiconductor device of rating class 600A is provided. Thus, a size of a semiconductor device of this class are remarkably reduced.

Also, although the size of the insulating substrate 2 is reduced, a copper plate may be employed as a metal base plate 1 assembled with an aluminum nitride insulator plate 3 instead of an expensive copper-molybdenum alloy base plate, which is necessary in the conventional semiconductor device in FIGS. 4 to 6. The metal base plate 1 made of copper has a thermal expansion coefficient that is considerably different from that of the aluminum nitride insulator plate 3. However, the copper has a high thermal conductivity and is low-cost. Therefore, not only a high level balance between a capacity and a size of the semiconductor device, but also a remarkably reduced manufacturing cost of the device is achieved without lowering the resistibility of the solder layer 9 against the heat cycles.

In this embodiment, a copper plate is used as the metal base plate 1, and an aluminum nitride insulator plate 3 with copper sheet back-side pattern 5 is used as the insulating substrate 2. However, above-described effects can be achieved with other kind of materials; for example, an aluminum plate as the metal base plate 1; a plate made of other ceramics such as alumina or silicon nitride as the insulator plate 3; and aluminum sheet as the back side pattern 5.

While solder is used as a binding material between the metal base plate 1 and the back-side pattern of the insulating substrate 2, solder free from Pb (Pb fee solder) may also be employed. Instead of solder, other binders, such as silver braze, silver paste or epoxy resin may also be used.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be constructed as being included therein.

What is claimed is:

1. A semiconductor device for controlling electricity comprising:

a metal base plate; and at least one insulating substrate including, an insulator plate, a back-side pattern on a back face of said insulator plate, said backside pattern being bonded to said metal base plate, and first and second circuit patterns located on a front face of said insulator plate and above said back-side pattern, each of said first and second circuit patterns including a switching element for controlling electricity made of a semiconductor, a free-wheel diode paired with said switching element, and an electrode area;

wherein each of said first and second circuit patterns is of a shape of a figure "L" and extends along two sides of said insulator plate which sides are continuously connected to each other and lie perpendicular to each other, and said first and second circuit patterns are arranged at opposed corners of said insulator plate in a centro-symmetrical relation to each other, wherein said switching element is sandwiched between said free-wheel diode and said electrode area in each of said first and second circuit patterns, wherein said two switching elements and said two free-wheel diodes are arranged in a checker pattern and are sandwiched by two auxiliary electrodes placed along opposite sides of said insulator plate such that a center axis of the switching element in the first circuit pattern substantially coincides with a center axis of the free-wheel diode in the second circuit pattern, and a center axis of the free-wheel diode in the first circuit pattern substantially coincides with a center axis of the switching element in the second circuit pattern, said two auxiliary electrodes being bonded to the electrode area and having a center axis substantially parallel to the center axes of the two switching elements and the two free-wheel diodes, and wherein the center axes of the switching element in the first circuit pattern and the free-wheel diode in the second circuit pattern are different than the center axes of the free-wheel diode in the first circuit pattern and the switching element in the second circuit pattern.

2. The semiconductor device according to claim 1, wherein said insulator plate is made of ceramics; said back-side pattern and said first and second circuit patterns are made of copper or aluminum; said metal base plate is made of copper or aluminum; and said back-side pattern is bonded to said metal base plate with solder.

3. The semiconductor device according to claim 1, wherein said switching element is of a rectangle shape having sides of a length greater than 14 mm and fits in an area of 25 mm radius on a front face of said insulating substrate.

4. The semiconductor device according to claim 1, wherein a temperature sensor is placed on said switching device at or near a corner of said back-side pattern.

5. The semiconductor device according to claim 1, wherein the two auxiliary electrodes extend to corners of the back-side pattern.

* * * * *